(12) United States Patent
Reid

(10) Patent No.: US 7,934,130 B2
(45) Date of Patent: Apr. 26, 2011

(54) SYSTEM AND METHOD FOR MANAGING NON-VOLATILE MEMORY BASED ON HEALTH

(75) Inventor: Robert Alan Reid, Superior, CO (US)

(73) Assignee: Cadence Design Systems, Inc., San Jose, CA (US)

( * ) Notice: Subject to any disclaimer, the term of this patent is extended or adjusted under 35 U.S.C. 154(b) by 248 days.

(21) Appl. No.: 12/201,937

(22) Filed: Aug. 29, 2008

(65) Prior Publication Data

US 2010/0058119 A1    Mar. 4, 2010

(51) Int. Cl.
*G06F 11/00* (2006.01)
(52) U.S. Cl. .......................................................... 714/42
(58) Field of Classification Search .................. 714/2–8, 714/15, 16, 19–21, 27, 31, 39, 42, 47, 48, 714/54
See application file for complete search history.

(56) References Cited

U.S. PATENT DOCUMENTS

| | | | | |
|---|---|---|---|---|
| 6,493,656 | B1 * | 12/2002 | Houston et al. | 702/187 |
| 7,216,277 | B1 * | 5/2007 | Ngai et al. | 714/733 |
| 7,412,575 | B2 * | 8/2008 | Park et al. | 711/159 |
| 7,571,356 | B2 * | 8/2009 | Inoue et al. | 714/42 |
| 7,759,968 | B1 * | 7/2010 | Hussein et al. | 326/38 |
| 2007/0174719 | A1 * | 7/2007 | Inoue et al. | 714/42 |
| 2008/0010530 | A1 * | 1/2008 | Davies et al. | 714/31 |
| 2008/0163014 | A1 * | 7/2008 | Crawford et al. | 714/723 |
| 2009/0300707 | A1 * | 12/2009 | Garimella et al. | 726/1 |

* cited by examiner

*Primary Examiner* — Nadeem Iqbal
(74) *Attorney, Agent, or Firm* — Patent Venture Group; Joe A. Brock, II

(57) ABSTRACT

An invention is provided for managing non-volatile memory having a plurality of memory blocks and a plurality of error values associated with the memory blocks. The method includes recording an error value indicating a number of errors occurring in a memory block during an operation accessing the memory block. The error values can then be aggregated to calculate an overall health of the memory, or used individually, for example, by selecting a memory block for a memory operation based on the associated error value. In general, the error value is updated when the most recent number of errors occurring in the memory block during an operation accessing the memory block is greater than a current recorded value.

21 Claims, 9 Drawing Sheets

SYSTEM AND METHOD FOR MANAGING NON-VOLATILE MEMORY BASED ON HEALTH

BACKGROUND OF THE INVENTION

1. Field of the Invention

This invention relates generally to non-volatile memory, and more particularly to managing non-volatile memory based on the health of the non-volatile memory.

2. Description of the Related Art

Non-volatile memory is memory that stores data when power is disconnected from the system. Phase-change memory (PCM) and flash memory are examples of non-volatile computer memory in use today. Flash memory is a non-volatile computer memory that can be electrically erased and reprogrammed. Because flash memory retains stored data even when power to the memory is turned off, flash memory is widely used in battery-driven portable devices. For example, flash memory often is utilized in digital audio players, digital cameras, mobile phones, and USB flash drives, which are used for general storage and transfer of data between computers.

Unlike many other storage devices, flash devices cannot be overwritten. Instead, to update data in a particular storage location within flash memory, the location must first be erased, then the new data written in its place. Moreover, when erasing data in a flash device, an entire block must be erased instead of just the particular page or pages of the block that were updated. To facilitate this process, a typical flash controller will find a block of memory that has been previously erased and write the updated page to this new block at the same page offset. Then, the remaining pages of the old block are copied to the new block. Later, the old block is erased and made available for use by some other operation.

However, there are electrical limitations to the number of times a memory block can be erased and reprogrammed before the block ceases to function properly. When this occurs, the flash memory system typically experiences a general degradation of overall performance and capacity. In some instances, memory performance within a non-volatile memory system can depend on how often the individual memory blocks are erased and reprogrammed. For example, if a block is erased repeatedly, that block may wear out relatively quickly. On the other hand, if a block is programmed and the data is allowed to remain for a significant amount of time, the block may wear relatively slowly.

To increase the life of non-volatile memory, prior art techniques have been developed wherein wear leveling based on the number of erase-write cycles is performed on the memory. Wear leveling procedures attempt to utilize the memory in an even fashion, distributing erase-write cycles evenly across the individual memory blocks of the non-volatile memory. Typical wear leveling procedures attempt to estimate when a memory block will wear out based on the number of times the block is erased. These procedures assume that the more times a block is erased, the more errors will occur in the block, and eventually the block will cease to function properly. This approach often is supported by non-volatile memory manufactures, who generally provide an estimated number of times that a memory block can be erased and/or reprogrammed before a particular chance of failure will occur.

FIG. 1 is a graph 100 showing erase counts of a prior art non-volatile memory having low erase-write cycle blocks and high erase-write cycle blocks. In FIG. 1 each bar represents the relative number of erase-write cycles occurring within each memory block, with longer bars indicating a larger number of erase-write cycles. The memory starts at memory block 0 and ends at memory block N. In the example of FIG. 1, several low erase-write cycle memory blocks 102 are present in the memory. These memory blocks 102 represent memory blocks that have been programmed relatively very few times. For example, they can represent blocks storing a user's favorite songs in an MP3 player. Because the user does not want to remove the songs, the memory blocks 102 storing the song data is programmed once with the song and then not reprogrammed. While the remaining memory blocks 104 are reprogrammed regularly with song data that the user only stores for a relatively short period of time. As a result, the memory blocks 102 storing the favorite songs experience a low number of erase-write cycles, while the remaining memory blocks 104 storing transient songs experience a much higher number of erase-write cycles. As a result, prior art wear leveling techniques will regard the memory blocks 104 experiencing a high number of erase-write cycles as having a shorter amount of remaining useful life than the memory blocks 102 experiencing a lower number of erase-write cycles.

However, in reality, devices are different. That is, estimates of useful life based on the number erase-write cycles experienced by a memory block are not always accurate. For example, in FIG. 1, a memory block 104 experiencing a high number of erase-write cycles can actually have the same amount of, or more, remaining useful life than a memory bock 102 experiencing a lower number of erase-write cycles. This is because one non-volatile memory device may function and react differently to the same usage as another non-volatile memory device, even from the same manufacturer. Thus, wear estimates based on erased counts and/or manufacturer estimates generally do not provide an accurate indication of memory block life in a particular device.

Hence, in view of the foregoing, there is a need for systems and methods for providing accurate knowledge of the current abilities of the memory blocks based on actual memory block performance instead of predictive memory block performance. The systems and methods should allow memory blocks to wear out evenly allowing increased memory usage. Moreover, the systems and methods should provide effective leveling without undue overhead costs and additional memory usage.

SUMMARY OF THE INVENTION

Broadly speaking, the present invention addresses these needs by providing health leveling in a non-volatile memory system utilizing error value entries to indicate levels of health for each memory block and/or page in a non-volatile memory system. The health level of a memory unit (i.e., a memory block or memory page) relates to the number of bits with data errors that occur when performing a memory access operation using the particular memory unit. For example, one embodiment is a method for providing health leveling in a non-volatile memory system having a plurality of memory units and a plurality of error values associated with the memory units. The method includes recording an error value indicating a number of errors occurring in a memory unit during an operation accessing the memory unit. The error values can then be aggregated to calculate an overall health of the memory, or used individually, for example, by selecting a memory unit for a memory operation based on the associated error value. In general, the error value is updated when the most recent number of errors occurring in the memory unit during an operation accessing the memory unit is greater than a current recorded value, and not updated when a most recent number of errors is less than a current recorded value. As will be described in greater detail subsequently, the memory health data can be used for memory management, such as dynamic health leveling and static health leveling. For example, when receiving a request to write data to non-volatile memory, the error values can be searched to find the lowest error value, and the data can be stored in the memory unit associated with the lowest error value, which is also a free memory unit. For static health leveling, the error values can be searched for a highest error value, and the lowest error value, and the data stored in the memory unit associated with the lowest error value can be moved to the memory unit associated with the highest error value, which is also a free memory unit.

A non-volatile memory system having health leveling functionality is disclosed in an additional embodiment of the present invention. The non-volatile memory system includes a plurality of memory units, and a plurality of error values each associated with a particular memory unit. In addition, logic is included that updates the error value associated with a memory unit when the number of errors occurring in the memory unit during a memory access operation is greater than the error value. When updated, the error value can be set to be equal to the number of errors occurring in the memory unit during the memory access operation. Optionally, when the most recent number of errors occurring in the memory unit during an operation accessing the memory unit is less than the current recorded value, the error value is not updated. Similar to above, logic can be included that searches the plurality of error values for the lowest error value upon receiving a request to write data to non-volatile memory. Once found, the data can be stored in the memory unit associated with the lowest error value. Upon receiving a request to perform static leveling, static health leveling logic can search the plurality of error values for a highest error value and a lowest error value, and move data stored in a memory unit associated with the lowest error value to the memory unit associated with the highest error value. As an optional diagnostic, logic can be included that erases a memory unit and records an erase error value equal to a number of memory cells that do not erase. Logic then programs all memory cells of the memory unit and records a program error value equal to a number of memory cells that do not retain a programmed value. Then, logic can be included that sets an error value associated with the memory unit equal to the sum of the erase error value and the program error value.

In a further embodiment, a data structure arranged in non-volatile memory to facilitate health based management is disclosed. The data structure includes a plurality of error value entries indicating errors occurring in memory units comprising the non-volatile memory. As above, each error value entry is associated with a particular memory unit in non-volatile memory. In use, each error value entry is set equal to the number of errors occurring in the associated memory unit during a memory access operation. In particular, an error value entry can be set to equal the number of errors occurring in the memory unit during a memory access operation when the number is greater than the value currently stored in the error value entry, and not set when the number is less than or equal to the value currently stored in the error value entry. In one aspect, the data structure can form a portion of a block table.

In this manner, embodiments of the present invention can determine health levels of memory units relative to each other. Also, by storing an indication of the number of errors occurring during a memory access for a particular area of memory, embodiments of the present invention are able to utilize a small amount of memory to indicate health levels. Moreover, embodiments of the present invention allow memory management based on actual performance of the memory instead of predictive performance, as done using counters. As a result, embodiments of the present invention advantageously increase the accuracy of memory management and thus increase the life of the non-volatile memory. Other aspects and advantages of the invention will become apparent from the following detailed description, taken in conjunction with the accompanying drawings, illustrating by way of example the principles of the invention.

BRIEF DESCRIPTION OF THE DRAWINGS

The invention, together with further advantages thereof, may best be understood by reference to the following description taken in conjunction with the accompanying drawings in which.

DETAILED DESCRIPTION OF THE PREFERRED EMBODIMENTS

An invention is disclosed for managing a non-volatile memory system by determining a health for the non-volatile memory system utilizing error values. Broadly speaking, embodiments of the present invention utilize error values to indicate relative levels of health for each memory block or page in a non-volatile memory system. The health of a memory block or page relates to the number of bits with data errors that occur when performing a memory access operation using the particular memory block or page. If there are no bit errors, the memory block or page is defined to have perfect health. If the memory block or page has uncorrectable errors, the memory block or page has fatal errors and is defined to be dead, and of no further use to the system. However, if the memory block or page has correctable errors, the health of the memory block or page is measured by the related error value, which is a measure of the number of bits in error that have occurred when accessing the particular memory block or page. These error values can further be utilized in aggregate, to determine an overall aggregate health for the memory. Thus, embodiments of the present invention allow management of non-volatile memory based on actual memory block performance instead of predictive memory block performance.

In the following description, numerous specific details are set forth in order to provide a thorough understanding of the present invention. It will be apparent, however, to one skilled in the art that the present invention may be practiced without some or all of these specific details. In other instances, well known process steps have not been described in detail in order not to unnecessarily obscure the present invention. Moreover, although the following description will be in terms of measuring actual memory block performance, it should be noted that error values can be utilized on a page basis, wherein each page is assigned an error value occurring during memory access operations utilizing that page. Furthermore, the term "memory unit" shall be used in the current description and claims to refer to a memory block and/or memory page. Thus, the term memory shall be used interchangeably with the terms "memory block" and "memory page."

Figure 1:
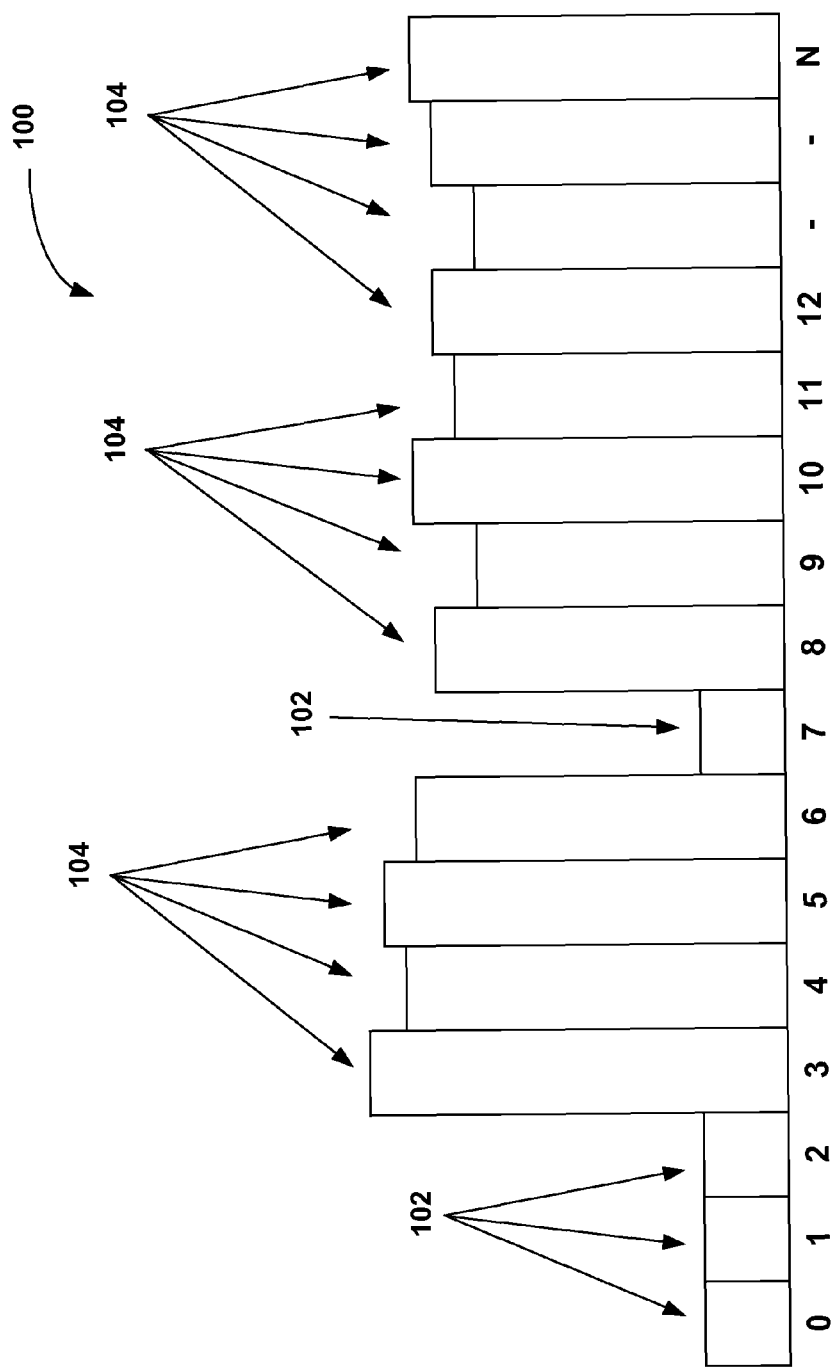
FIG. 1 is a graph showing relative erase-write cycles of a prior art non-volatile memory having low erase-write cycle blocks and high erase-write cycle blocks.
Figure 2:
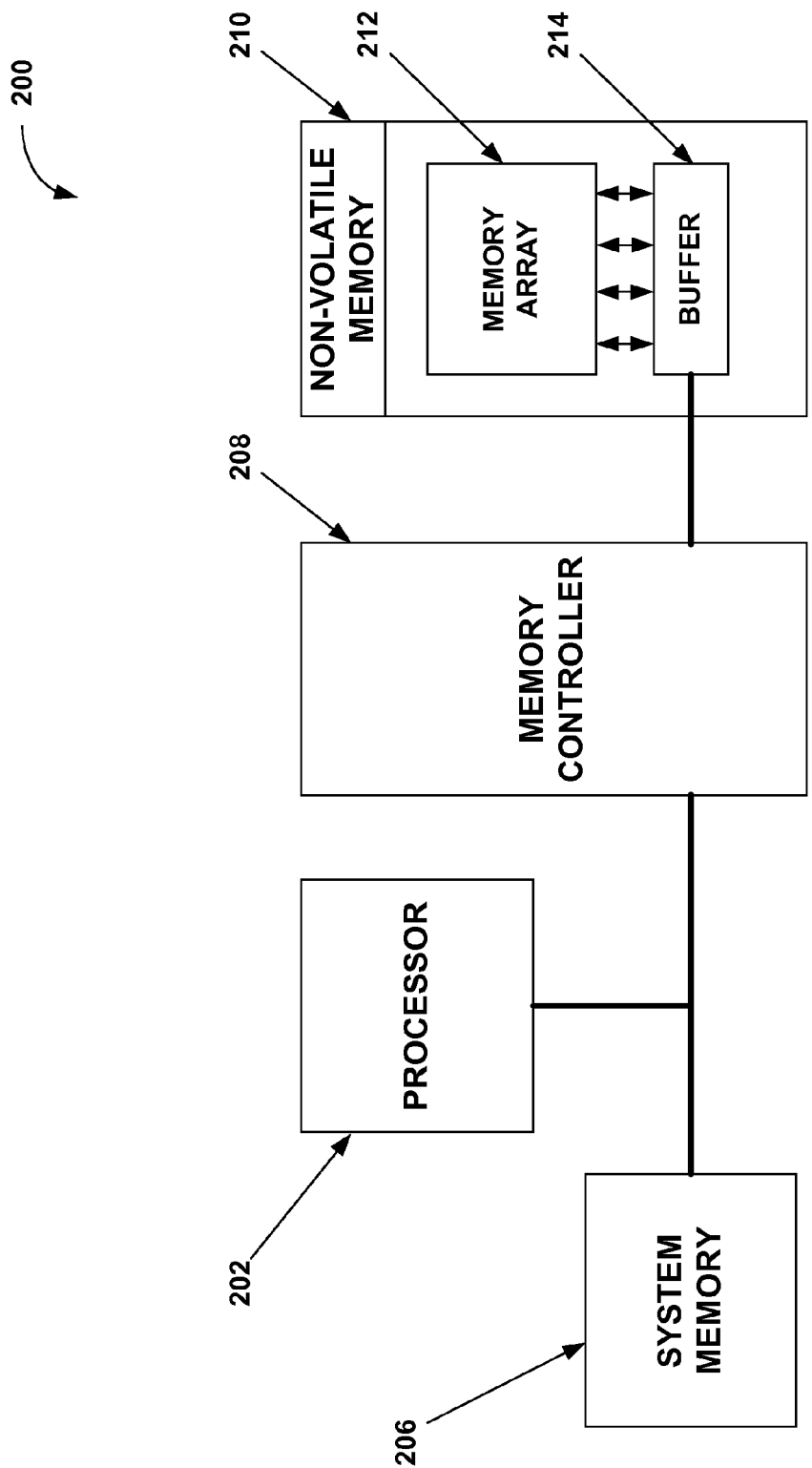
FIG. 2 is a diagram showing a system, which includes non-volatile memory with health management logic utilizing relative error values to evaluate actual block performance, in accordance with an embodiment of the present invention.

FIG. 1 was described in terms of the prior art. FIG. 2 is a diagram showing a system 200, which includes non-volatile memory with health management logic utilizing relative error values to evaluate actual block performance, in accordance with an embodiment of the present invention. The system 200 includes a host processor 202 coupled to system memory 206. The host processor 202 also is coupled to a memory controller 208, which is in communication with a non-volatile memory 210. The non-volatile memory 210 includes a memory array 212 coupled to a buffer 214. The non-volatile memory 210 can be any type of non-volatile memory, such as PCM, flash memory, or any other type of non-volatile memory as will be apparent to those skilled in the art after a careful reading of the present disclosure.

During normal operation, the processor 202 utilizes the system memory 206 for many logic operations. When access to the non-volatile memory 210 is required, the processor 202 generally utilizes the memory controller 208 to read and write data to the non-volatile memory 210. To write data to the non-volatile memory 210, the processor generally instructs the memory controller 208 to transfer the data from the system memory 206 into the buffer 214 of the non-volatile memory 210. The data then is transferred from the buffer 214 and stored into the memory array 212. When the data is later read from the non-volatile memory 210, the data is transferred from the memory array 212 to the buffer 214. The memory controller 208 then reads the data from the buffer 214, and stores the data into the system memory 206 for use by the host processor 202. Typically, data is arranged in the memory array 212 in blocks, each comprised of a plurality of pages, as illustrated in FIG. 3.

Figure 3:
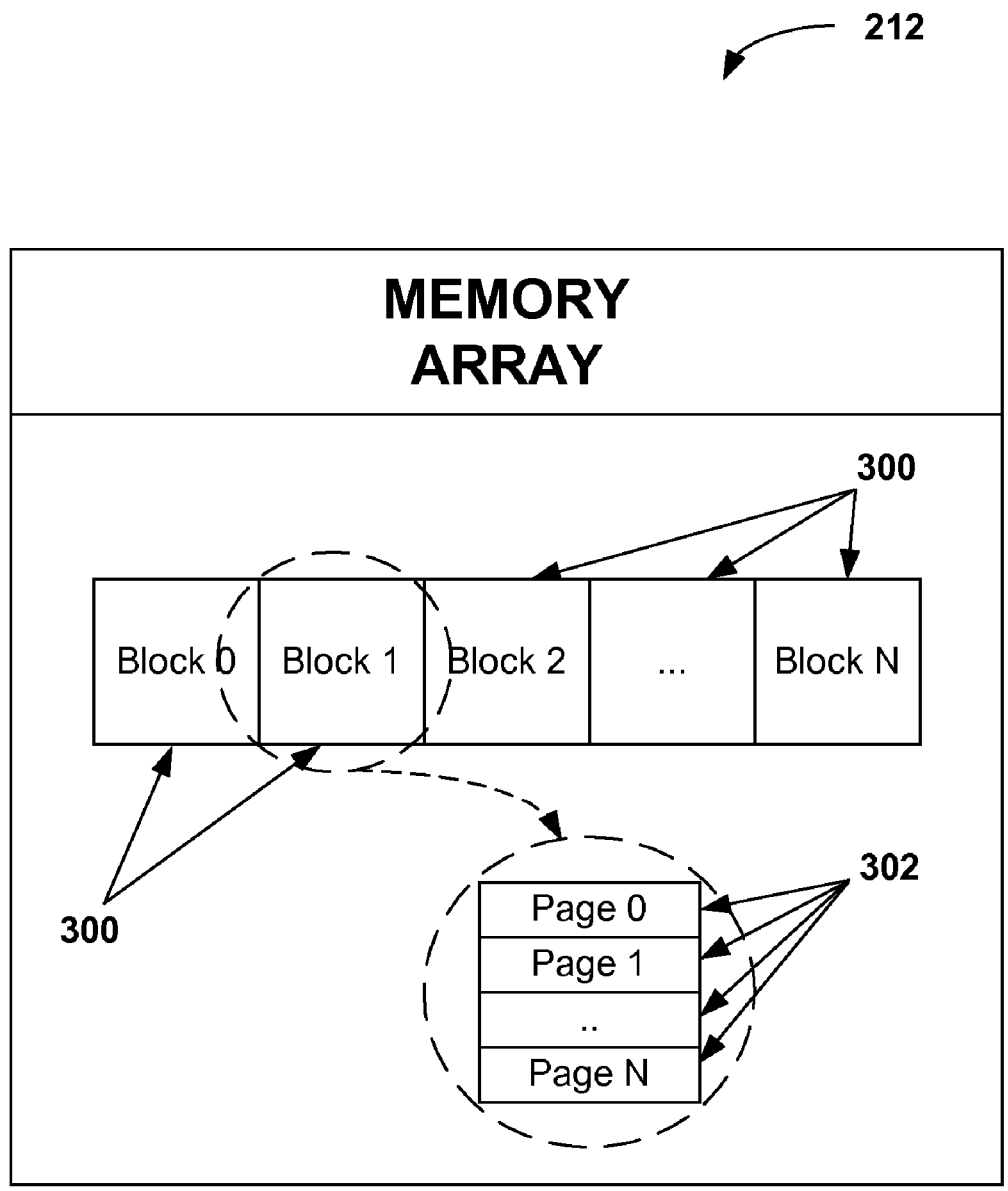
FIG. 3 is a block diagram showing an exemplary memory array, in accordance with an embodiment of the present invention.

FIG. 3 is a block diagram showing an exemplary memory array 212, in accordance with an embodiment of the present invention. As illustrated in FIG. 3, the memory array 212 generally includes a plurality of memory blocks 0-N 300, which typically is the smallest unit of memory that can be erased. Each memory block 300 is comprised of a plurality of pages 302, which generally are the smallest unit of programming. That is, when writing or reading data to and from the memory array 212, an entire page 302 of data generally is accessed at one time. When erasing data, an entire memory block 300 generally is the minimum amount of data that is erased in each operation.

As mentioned previously, there are electrical limitations to the number of times a memory block 300 can be erased and reprogrammed before the memory block 300 ceases to function properly. When this occurs, the memory system typically experiences loss of stored data and a general degradation of overall performance. Typical wear leveling procedures attempt to estimate when a memory block will wear out based on the number of times the block is erased. These procedures assume that the more times a block is erased, the more errors will occur in the block, and eventually the block will cease to function properly. However, in reality, devices are different. That is, one non-volatile memory device may function and react differently to the same usage as another non-volatile memory device, even from the same manufacturer. To increase accuracy and prolong the useful life of non-volatile memory, embodiments of the present invention allow management of non-volatile memory based on actual memory block performance utilizing error values to indicate relative levels of health for each memory block or page in a non-volatile memory system, as illustrated next with reference to FIG. 4.

Figure 4:
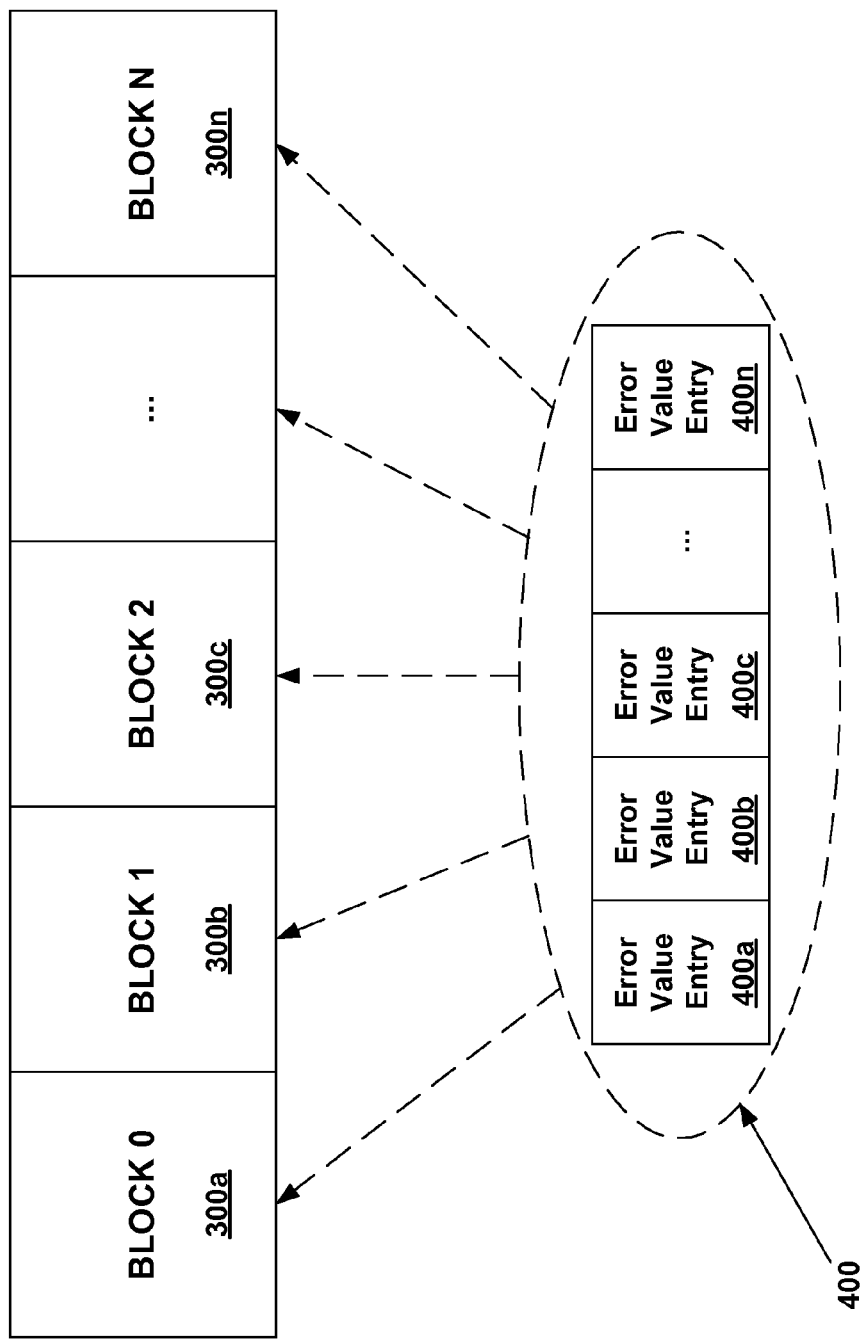
FIG. 4 is a block diagram showing the relation between memory blocks and error value entries, in accordance with an embodiment of the present invention.

FIG. 4 is a block diagram showing the relation between memory units 300 and error value entries 400, in accordance with an embodiment of the present invention. As mentioned above, embodiments of the present invention extend the life of non-volatile memory using a method based on actual memory unit 300 performance. To this end, embodiments of the present invention associate an error value entry 400 with each memory unit 300 in the memory array. It should be noted that each memory unit 300 can be a memory block or memory page, depending on the design needs of the system. As such, the current description and claims use the terms "memory unit" interchangeably with the terms "memory block" and "memory page." For example, in FIG. 4, error value entry 400*a* is associated with memory block 0 300*a*, error value entry 400*b* is associated with memory block 1 300*b*, error value entry 400*c* is associated with memory block 2 300*c*, and so on to error value entry 400*n*, which is associated with memory block N 300*n*.

An error value entry 400*a*-400*n* stores an error value, which is a measurement of the errors that have occurred when accessing the particular memory block 300*a*-300*n* or page. For example, the error value can be the highest number of bits in error occurring in any previous read. Broadly speaking, each error value is a number indicating the number of errors occurring in a memory block 300*a*-300*n* during an operation accessing the memory block 300*a*-300*n*. In general, the error value is updated when the most recent number of errors occurring in the memory block during an operation accessing the memory block is greater than the current recorded value. Otherwise, the error value is not updated. In this manner, the error value entry 400*a*-400*n* related to a memory block 300*a*-300*n* stores a number indicating the highest number of bit errors that have occurred at one time while accessing the memory block 300*a*-300*n*. Alternatively, each error value entry 400*a*-400*n* can be an average of read errors occurring over a predetermined period of time or any other measurement of errors including correctable error counts or detectable error counts.

As discussed previously, the health of a memory block 300*a*-300*n* or page relates to the number of data errors that occur when performing a memory access operation using the particular memory block or page. Hence, if there are no bit errors, the memory block or page is defined to have perfect health. If the memory block 300*a*-300*n* or page has uncorrectable errors, the memory block 300*a*-300*n* or page has fatal errors and is defined to be dead, and of no further use to the system. However, if the memory block 300a-300n or page has correctable errors, the health of the memory block or page is measured by the related error value entry 400a-400n, which is a measure of the number of bits in error that have occurred when accessing the particular memory block 300a-300n or page.

In one embodiment, the highest value that will be stored in an error value entry 400a-400n is equal to the highest number of bit errors that can be corrected using the error correction code (ECC) logic present in the system. For example, if the current ECC hardware present in the system can correct fifteen bits of errors in a particular memory access operation, the highest value that will be stored in any error value entry 400a-400n will be fifteen. If a memory access operation results in more than fifteen errors, the error is uncorrectable, and if this occurs on a consistent basis the memory block 300a-300n or page will be indicated as being unusable. In one embodiment, this is accomplished by setting the error value 400a-400n related to the particular memory block 300a-300n to a very high value, for example, 0xFF.

Thus, by examining the error value entries 400a-400n, embodiments of the present invention can determine which memory blocks 300a-300n have good health, which memory blocks 300a-300n have bad health, and the relative levels of memory block 300a-300n health. That is, the memory block 300a-300n associated with the error value entry 400a-400n having the highest value is the memory block that has had the highest number of errors and has the lowest health. Similarly, the memory block 300a-300n associated with the error value entry 400a-400n having the lowest value is the memory block that has the lowest number of errors and as a result has the highest health.

Although variances occur depending on the specific memory, typical non-volatile memory blocks often can withstand over 100,000 write-erase cycles before becoming unusable. Thus, to keep an absolute count of the number of times a memory block has been erased would require a counter capable of storing a value of at least 100,000. Storing a value of 100,000 requires a counter of at least three bytes. Thus, the amount of memory required to store a table of absolute erase counters requires a large amount of memory as the number of memory blocks increases. However, embodiments of the present invention do not use erase counters to determine the health of memory blocks or pages. Moreover, because of the relatively low numbers that will be stored, embodiments of the present invention can generally utilize only a single byte of memory to store the error value for a particular memory block or page. However, it should be noted that a plurality of bytes of memory can be utilized to store the error value for a particular memory block or page. In addition to the individual health of each block or page, embodiments of the present invention also determine an overall aggregate health value for the memory to assist in memory management.

Figure 5:
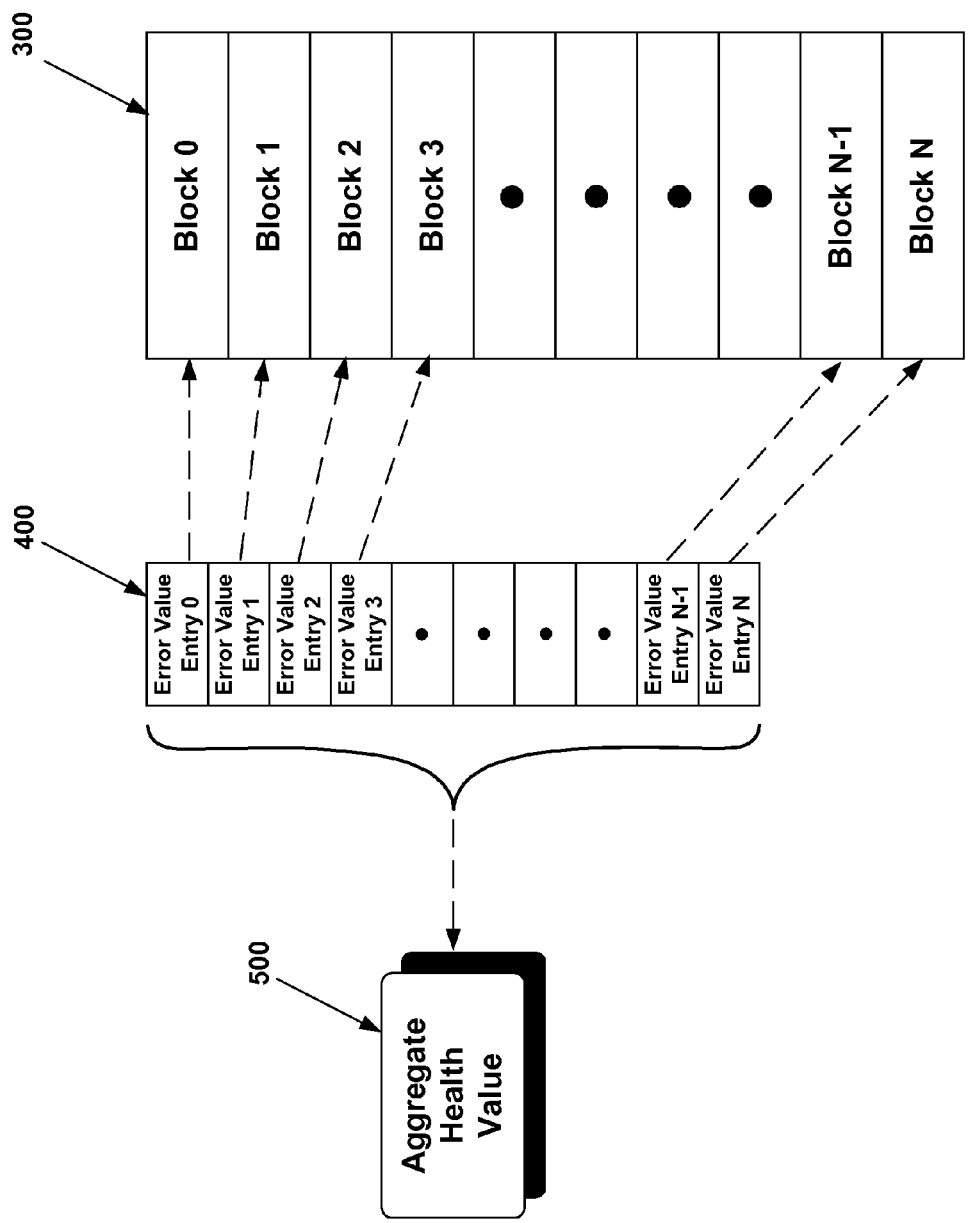
FIG. 5 is a block diagram showing the relation between individual error value entries 400 and the aggregate health value of the memory, in accordance with an embodiment of the present invention.

FIG. 5 is a block diagram showing the relation between individual error value entries 400 and the aggregate health value 500 of the memory, in accordance with an embodiment of the present invention. As mentioned above, embodiments of the present invention associate an error value entry 400 with each memory block 300 in the memory array. To provide an overall health determination for the memory, embodiments of the present invention also associate an aggregate health value 500 with the memory, which is based on all or most of the error value entries 400 associate with the memory blocks (and/or pages) 300 of the memory. The aggregate health value 500 is based on the error value entries 400 and can be determined in any manner that fits the use of health management for the memory. For example, in one embodiment, the aggregate health value 500 can be the sum of all the error value entries 400 for the memory. In an additional embodiment, the aggregate health value 500 can be a percentage calculated to illustrate the percentage of the blocks and/or pages 300 that are currently "healthy" or useable based on the values of the error value entries 400. In this embodiment, an aggregate health value 500 of 100% indicates a memory wherein all the blocks and/or pages 300 are currently useable, while an aggregate health value 500 0% indicates no blocks and/or pages 300 are currently useable in the memory. An aggregate health value 500 of 80%, for example, can indicate that 80% of the memory blocks and/or pages 300 are currently "healthy" or useable based on the values of the error value entries 400.

The aggregate health value 500 can be utilized in any number of ways depending on the needs of the system and/or user. For example, the aggregate health value 500 can be used as an indication of the life of the device. Here, a poor aggregate health value 500 indicates a device that is near the end of its useful life, while a good aggregate health value 500 can indicate a device that is good condition, for example, relatively new. The aggregate health value 500 of the memory can further be used by the operating system, which can adapt its storage algorithms, for example, based on the aggregate health value 500 of the memory. Moreover, the aggregate health value 500 can be reported to an end user as a warning, or other means to determine how or when to utilize the memory. For example, the aggregate health value 500 of a removable flash device can be reported to the user. The user can then evaluate whether the particular removable flash device should be appropriately used for a particular application. For example, the aggregate health value 500 for a camera flash card can be used by the user to determine whether to take the particular camera flash card on a trip. That is, if the aggregate health value 500 for the camera flash card is relatively low, the user may decide the risk of failure and resulting loss of potential digital photographs is too high for a once in a lifetime trip. However, if the user was merely taking routine photographs in their neighborhood, the risk of failure and resulting loss of potential digital photographs may be acceptable, since they can easily be replaced with other photographs.

As mentioned above, embodiments of the present invention do not use erase counters to determine the health of memory blocks or pages. Instead, the health of the memory is based on the actual performance of the memory based on errors occurring during memory access. Hence, in one embodiment, the value stored in each error value 400 entry can be generated utilizing the ECC logic present in the system, as discussed next with reference to FIG. 6.

Figure 6:
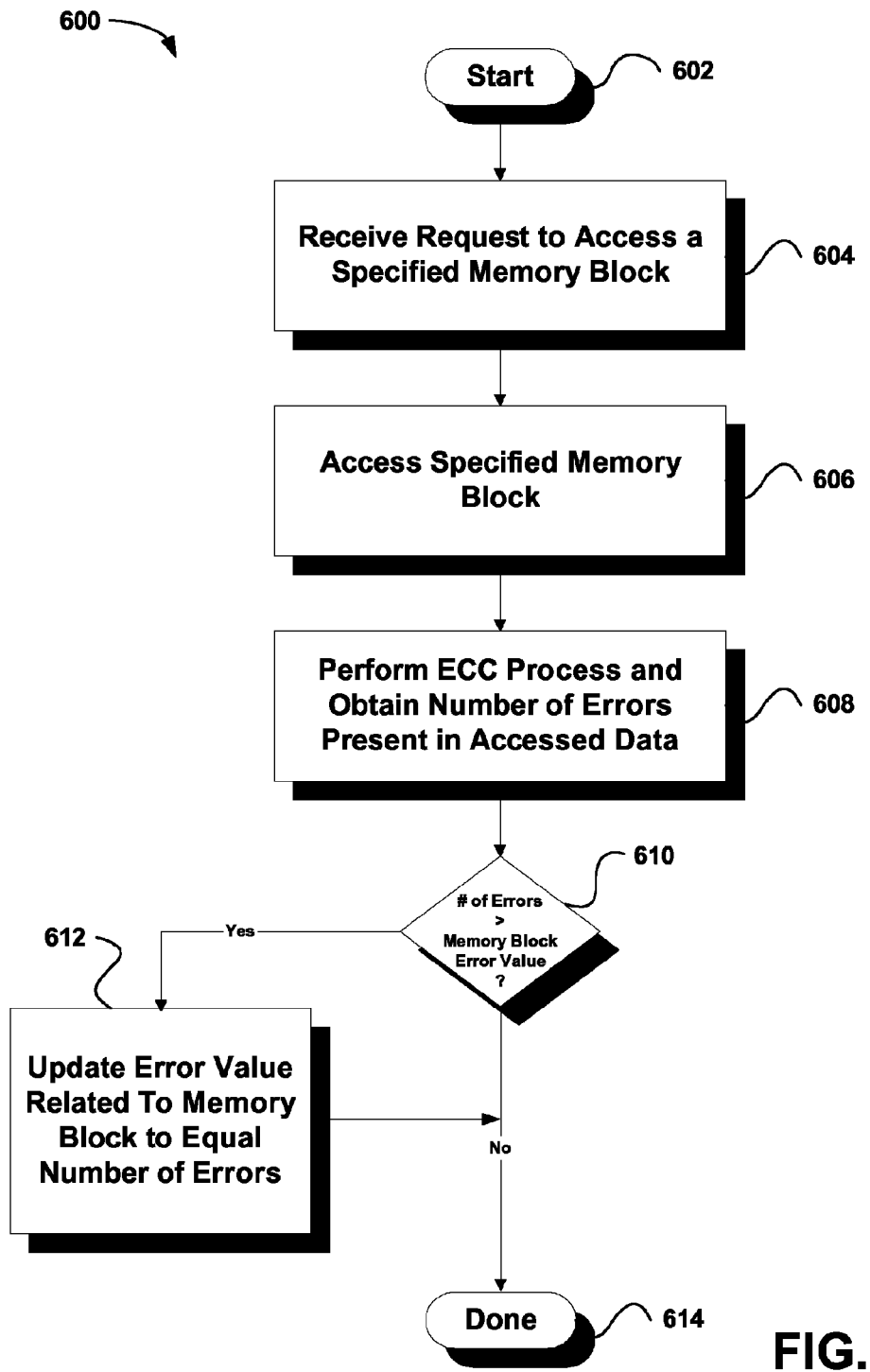
FIG. 6 is a flowchart showing a method for providing health leveling in a non-volatile memory system using error value entries, in accordance with an embodiment of the present invention.

FIG. 6 is a flowchart showing a method 600 for providing health leveling in a non-volatile memory system using error value entries, in accordance with an embodiment of the present invention. In an initial operation 602, preprocess operations are performed. Preprocess operations can include, for example, performing read/write operations, updating address tables, and other preprocess operations that will be apparent to those skilled in the art after a careful reading of the present disclosure.

In operation 604, a request to access a specified memory block is received. The request may include accessing a single memory block or a plurality of memory blocks depending on the needs of the system. Although reads and writes can be performed on a single page of data, typical non-volatile memory often has a minimum memory size that must be erased in a single operation. Generally, this minimum amount is one memory block.

Once the request is received, the specific memory block is accessed, in operation 606. For example, referring back to FIG. 5, a request may be received to access memory block 2 400c. In this case, the memory controller instructs the non-volatile memory device to access the data corresponding to the pages of memory block 2 400c. As mentioned above, the actual health of memory locations in a non-volatile memory system can depend on how the individual memory blocks are erased and reprogrammed. To increase the life of non-volatile memory, health leveling procedures that attempt utilize the memory in an even manner are performed on the memory. The embodiments of the present invention provide health leveling utilizing error value entries to indicate relative levels of health for each memory block in the memory array, as described in operation 608.

Referring back to FIG. 6, an ECC process is performed on the data from the memory access and the number of errors present in the accessed data is obtained, in operation 608. Continuing with the example of FIG. 5, when the data in memory block 500c is accessed, an ECC process is performed using the data stored in memory block 500c. The ECC process determines whether errors are present in the data, and if so, how many errors are present, and the locations of the errors. Hence, embodiments of the present invention can utilize existing ECC hardware to determine the number of bit errors present in data from a particular memory access.

Referring back to FIG. 6, a decision is made as to whether the number of errors present in the data from the memory access operation is greater than the error value currently stored in the error value entry associated with the memory block accessed, in operation 610. Although embodiments of the present invention will be described in terms of testing for the number errors being greater than the current error value associated with the memory location, it should be noted that other tests can be used, such as equality, or the error value can be constantly updated with the latest error count for the memory block, depending on the needs and implantations of the system design. If the number of errors present in the data from the memory access operation is greater than the error value stored in the error value entry associated with the memory block accessed, the method 600 branches to operation 612. Otherwise the method 600 ends with operation 614.

In operation 612, the error value entry associated with the accessed memory block is updated to store the current number of errors present in the data from the memory access operation. Continuing with the example of FIG. 5, the corresponding error value entry for memory block 2 400c is error value entry 500c. Thus, in this example, if the number of errors present in the data from the memory access operation is greater than the error value stored in error value entry 500c, error value entry 500c is updated to store the current number of errors present in the data from the memory access operation.

Turning back to FIG. 6, post process operations are performed in operation 614. Post process operations can include, for example, performing dynamic health leveling functions, performing static health leveling functions, and other post process operations that will be apparent to those skilled in the art after a careful reading of the present disclosure. As an optional diagnostic, logic can be included that erases a memory block and records an erase error value equal to a number of memory cells that do not erase. Logic then programs all memory cells of the memory block and records a program error value equal to a number of memory cells that do not retain a programmed value. Then, logic can be included that sets an error value associated with the memory block equal to the sum of the erase error value and the program error value.

Thus, embodiments of the present invention can determine health levels of memory blocks relative to each other. Also, by storing an indication of the number of errors occurring during a memory access for a particular area of memory, embodiments of the present invention are able to utilize a small amount of memory to indicate health levels. As mentioned previously, typical non-volatile memory blocks often can withstand over 100,000 write-erase cycles before becoming unusable. Thus, to keep an absolute count of the number of times a memory block has been erased would require a counter capable of storing a value of at least 100,000, which requires a counter of at least three bytes. Because embodiments of the present invention are not required to store an absolute count of block erases, embodiment of the present invention can utilize error value entries that are only a single byte to store health levels of wear for memory blocks. As can be appreciated, in this example embodiments of the present invention can reduce the size of memory needed by a factor of three. Moreover, embodiments of the present invention allow memory management based on actual performance of the memory instead of predictive performance, as done using erase counters. As a result, embodiments of the present invention advantageously increase the accuracy of memory management and thus increase the life of the non-volatile memory. As mentioned previously, the aggregate health value of the overall memory can be used to manage memory. However, it should be noted that the health of individual blocks and/or pages can be utilized to provide memory management. For example, using a table of error value entries, embodiments of the present invention can perform health leveling either dynamically or statically based on actual performance of the memory.

Figure 7:
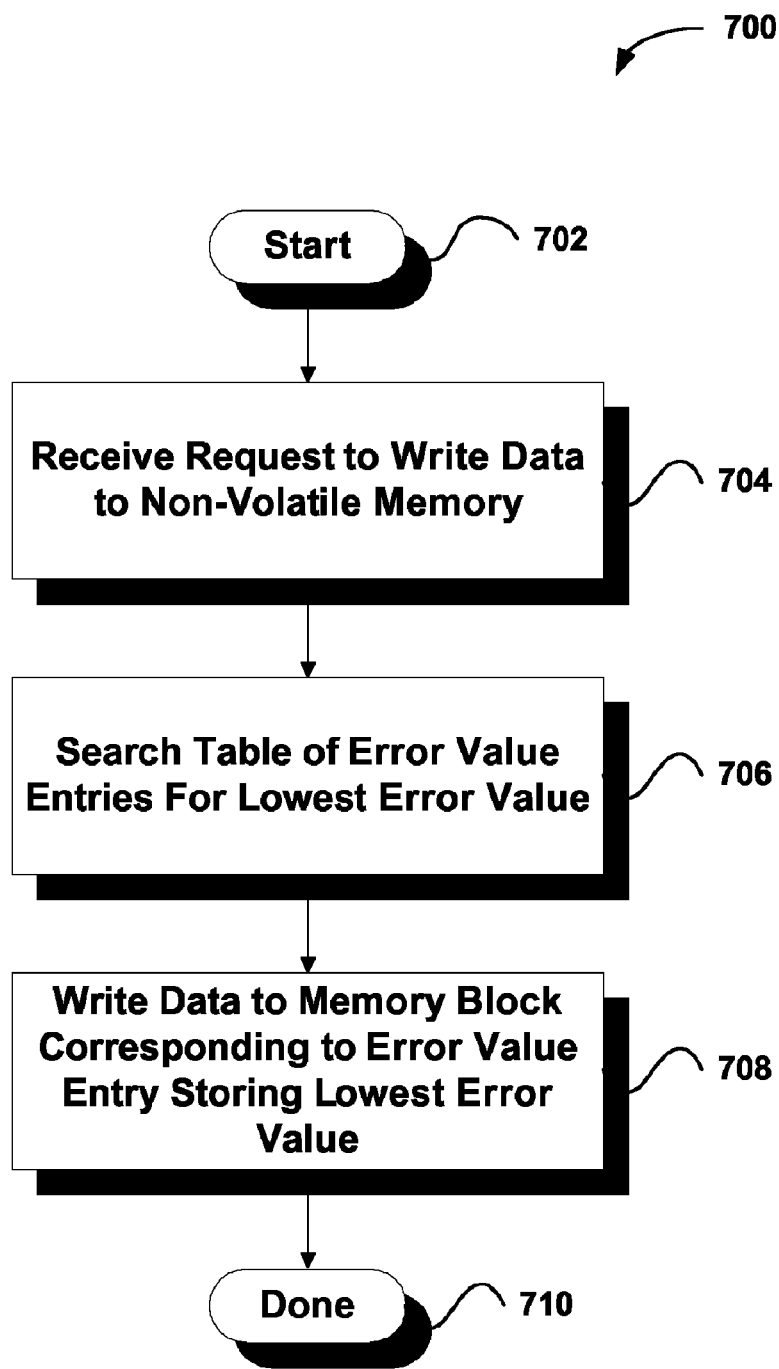
FIG. 7 is a flowchart showing a method for performing dynamic health leveling using error value entries, in accordance with an embodiment of the present invention.

FIG. 7 is a flowchart showing a method 700 for performing dynamic health leveling using error value entries, in accordance with an embodiment of the present invention. In an initial operation 702, preprocess operations are performed. Preprocess operations can include, for example, receiving requests to erase memory blocks, updating error value entries, and other preprocess operations that will be apparent to those skilled in the art after a careful reading of the present disclosure.

In operation 704, a request to write data to non-volatile memory is received. The request may include writing to a single page or a plurality of pages depending on the needs of the system. Although erase operations typically require an entire memory block to be erased, read and write operations generally can be performed on a single page of data.

Once the request is received, the table of error value entries is searched for the lowest stored value, in operation 706. As mentioned above with respect to FIG. 6, each time a memory block is accessed, embodiments of the present invention update the associated error value entry with the number of errors present in the data accessed if the number of errors is greater than the currently stored error value. Thus, the error value entries provide an indication of the health levels for the various memory blocks of the non-volatile memory. That is, using the error value entries, embodiments of the present invention can determine which memory block has the lowest (or worst) health level, and which memory block has highest (or best) health level. Thus, embodiments of the present invention determine which memory block has the best health by determining which error value entry stores the lowest error value. Alternatively, the search can locate the first, or any, block whose health level is above a threshold.

In operation 708, the data is written to the memory block corresponding to the error value entry storing the lowest error value. The memory block corresponding the error value entry having the lowest error value is the memory block experiencing the least number of errors during memory access operations, and thus the best health level. Hence, in operation 708, embodiments of the present invention write the data in the memory bock having the best health level. Alternatively, the data can be written to any selected block that has a health level above a threshold.

Post process operations are performed in operation 710. Post process operations can include, for example, receiving further erase requests, receiving further read/write requests, performing static health leveling, and other post process operations that will be apparent to those skilled in the art after a careful reading of the present disclosure. In this manner, embodiments of the present invention perform health leveling during normal operation when writing data to non-volatile memory, as illustrated next with reference to FIG. 8.

Figure 8:
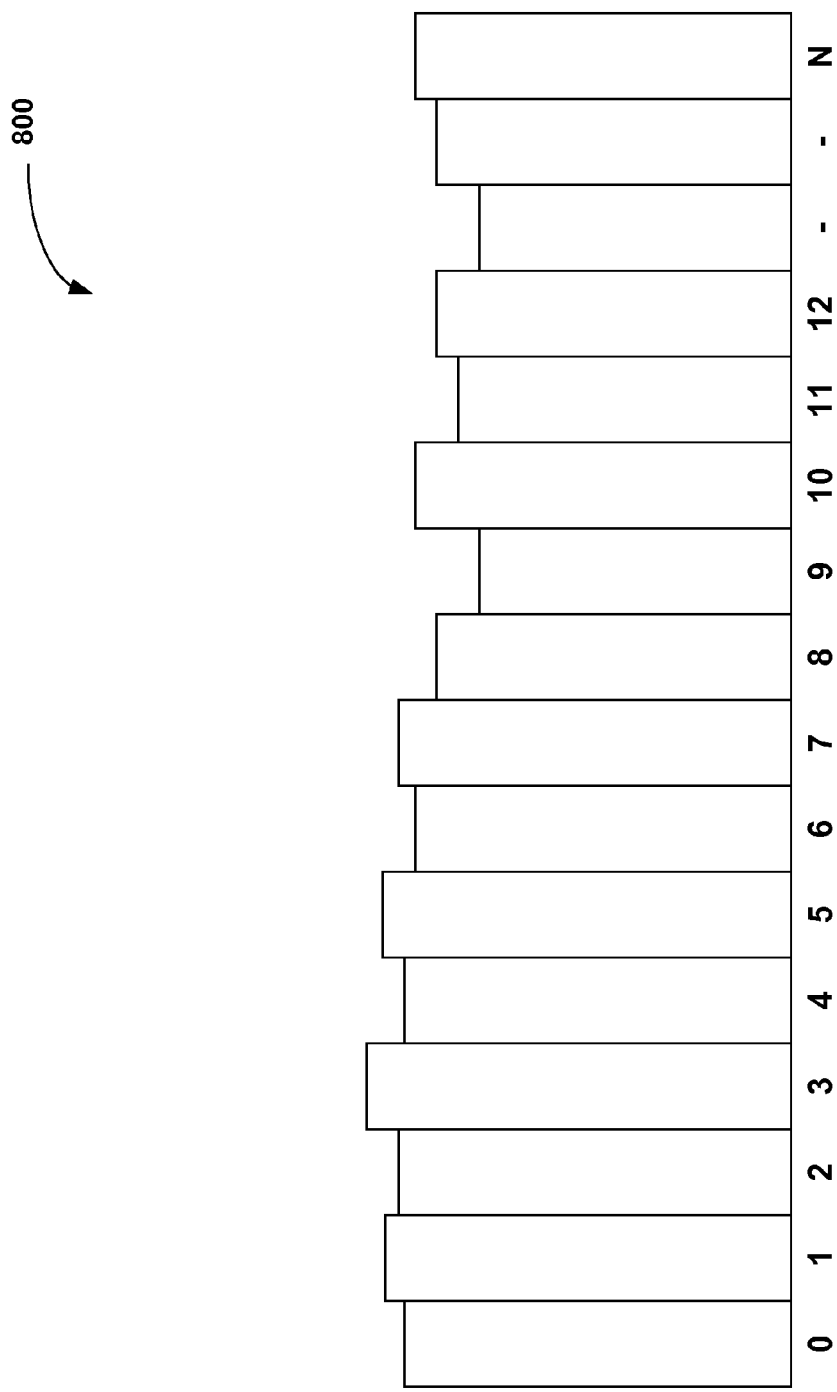
FIG. 8 is a graph showing relative health levels of a non-volatile memory using dynamic health leveling, in accordance with an embodiment of then present invention.

FIG. 8 is a graph 800 showing relative health levels of a non-volatile memory using dynamic health leveling, in accordance with an embodiment of then present invention. In FIG. 8 each bar represents the relative health level of a memory block, with longer bars indicating a larger number errors experienced, and thus a lower health level. The memory starts at memory 0 and ends at memory block N. As can be seen, when writing data to non-volatile memory utilizing dynamic health leveling as discussed with respect to FIG. 7, embodiments of the present invention utilize the memory in an even fashion. In addition to performing health leveling dynamically during write operations, embodiments of the present invention can perform static health leveling, as described next with reference to FIG. 9.

Figure 9:
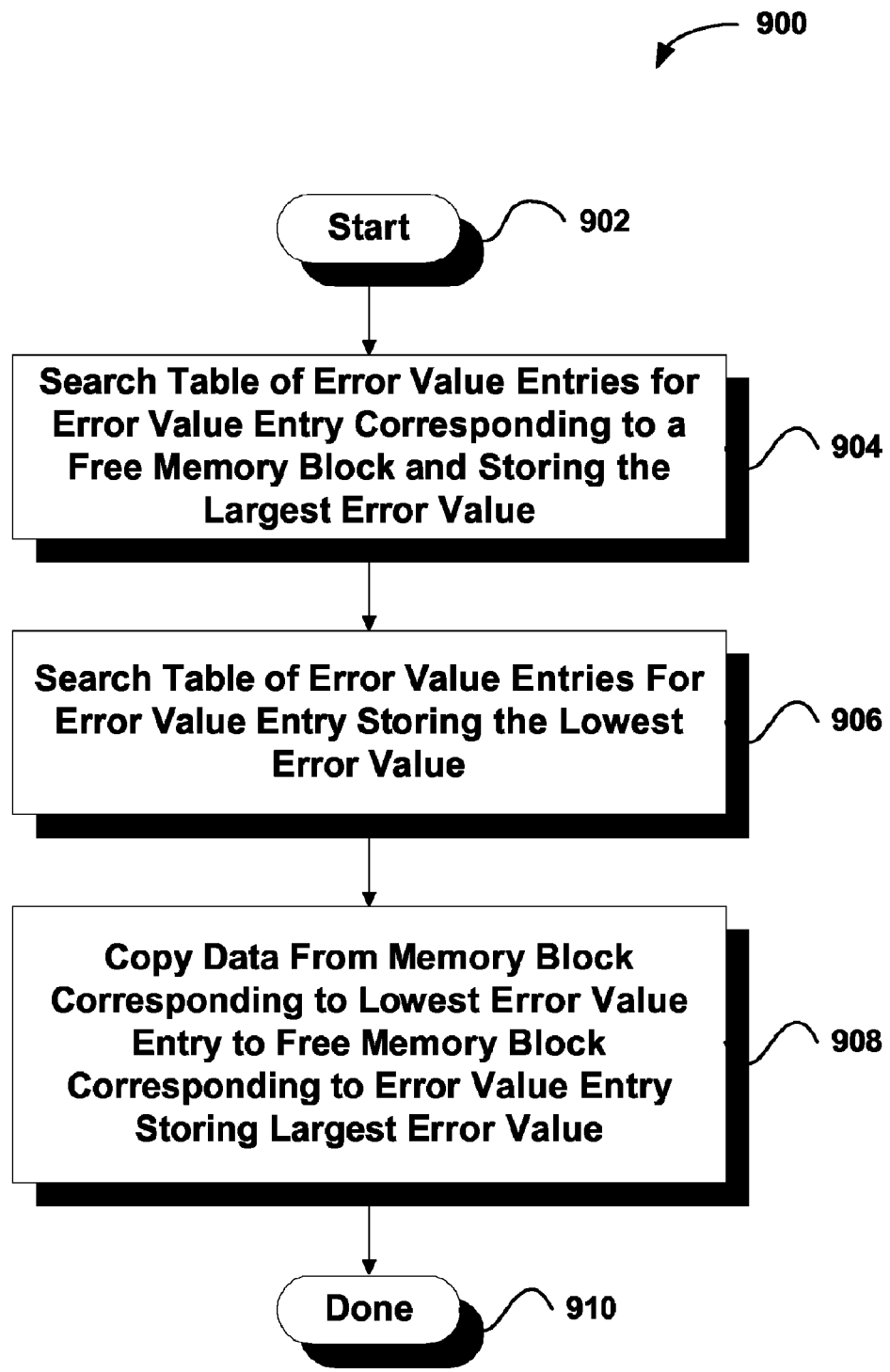
FIG. 9 is a flowchart showing a method for static health leveling utilizing error value entries, in accordance with an embodiment of the present invention.

FIG. 9 is a flowchart showing a method 900 for static health leveling utilizing error value entries, in accordance with an embodiment of the present invention. In an initial operation 902, preprocess operations are performed. Preprocess operations can include, for example, performing dynamic health leveling, receiving a static health leveling request, and other preprocess operations that will be apparent to those skilled in the art after a careful reading of the present disclosure.

In operation 904, the table of error value entries is searched for the error value entry corresponding to both a free memory block and storing the largest error value. One purpose of static health leveling is to reduce the usage of memory blocks having a low health level (i.e., experiencing many soft errors). To do this, embodiments of the present invention identify a free memory block having a low health level. The error value entry storing the largest error value, and corresponding to a free memory block, corresponds to the free memory block having the lowest health level. Once found, the memory block will be utilized to store data that is likely to be maintained in memory, without being erased frequently, as described next.

In operation 906, the table of error value entries is searched for the error value entry corresponding to a memory block currently in use and storing the lowest error value. Static data is data that is to remain stored in non-volatile memory for a relatively prolonged period of time. An example of such data is system data utilized for system operation. Such data stored in non-volatile memory generally is not erased once written to memory. Another example of generally static data can be favorite MP3 data or favorite image files. For example, when a user stores MP3 data for a favorite song, or a favorite image file, the user generally allows the data to remain in non-volatile memory. When such data is stored in non-volatile memory, the memory block or blocks storing such data typically have a relatively high health level because the data is stored and allowed to remain in non-volatile memory without being erased.

Thus, to determine which memory blocks store static data, embodiments of the present invention search for memory blocks having high health levels (i.e., experiencing few errors). The error value entry corresponding to a memory block currently in use and storing the lowest error value corresponds to a memory block having the best health level and thus is determined as capable of storing static data.

Once the two memory blocks are found, the data from the memory block corresponding to the error value entry storing the lowest error value is copied to the free memory block corresponding the error value entry storing the highest error value, in operation 908. As mentioned above, the data found in operation 906 is likely to remain relatively static, and thus unlikely to be erased frequently. Thus, embodiments of the present invention copy this data to the low health level free memory block found in operation 904 to slow the deterioration of the memory block. Alternatively, blocks with error rates below a threshold can be selected for copying to new blocks or a predetermined number (e.g. 10% of blocks in use) of the healthiest blocks can be copied. Alternatively, possible destination blocks with the worst health levels can be skipped in favor of blocks with relatively low health levels. Thus, use of the unhealthiest blocks can be avoided unless absolutely necessary.

Post process operations are performed in operation 910. Post process operations can include, for example, updating an address table to indicate the new location of the moved data, updating free memory usage data, and other post process operations that will be apparent to those skilled in the art after a careful reading of the present disclosure. In this manner, embodiments of the present invention determine where static data is stored, and move that data to low health level memory locations. Once static data is stored in a low health level memory location, the health deterioration in that location should slow because the static data is unlikely to be erased or at least erased less frequently. In one embodiment, static health leveling operations are performed in response to receiving a command to perform static health leveling. In this manner, static health leveling can occur during lowest use periods or when the non-volatile memory is otherwise idle.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A method for managing a non-volatile memory system, the non-volatile memory system including a plurality of memory units and a plurality of error values associated with the memory units, comprising the operations of:

recording an error value indicating a number of errors occurring in a memory unit during an operation accessing the memory unit; and updating the error value when a most recent number of errors occurring in the memory unit during an operation accessing the memory unit is greater than a current recorded value, wherein the error value is not updated when a most recent number of errors occurring in the memory unit during an operation accessing the memory unit is less than a current recorded value.

2. A method as recited in claim 1, further comprising the operation of selecting a memory unit for a memory operation based on the error value.

3. A method as recited in claim 1, further comprising the operations of:
   recording a plurality of error values, each error value indicating a number of errors occurring in an associated memory unit during an operation accessing the memory unit; and
   calculating an aggregate health value based on the plurality of error values, wherein the aggregate health value provides an indication of performance ability of the non-volatile memory.

4. A method as recited in claim 1, further comprising the operations of:
   receiving a request to write data to non-volatile memory;
   searching the plurality of error values for a lowest error value; and
   storing the data in the memory unit associated with the lowest error value.

5. A method as recited in claim 4, wherein the memory unit having the lowest value is a free memory unit.

6. A method as recited in claim 1, further comprising the operations of:
   searching the plurality of error values for a highest error value;
   searching the plurality of error values of a lowest error value; and
   moving data stored in a memory unit associated with the lowest error value to the memory unit associated with the highest error value.

7. A method as recited in claim 6, wherein the highest error value is associated with a free memory unit.

8. A method as recited in claim 1, further comprising the operations of:
   receiving a request to write data to non-volatile memory;
   searching the plurality of error values for a low error value; and
   storing the data in the memory unit associated with the low error value.

9. A method as recited in claim 1, further comprising the operations of:
   searching the plurality of error values of a low error value; and
   searching the plurality of error values for a higher error value;
   moving data stored in a memory unit associated with the low error value to the memory unit associated with the higher error value.

10. A method as recited in claim 9, wherein the higher error value is associated with a free memory unit.

11. A non-volatile memory system, comprising:
    a plurality of memory units;
    a plurality of error values, each error value being associated with a particular memory unit;
    logic that updates an error value associated with a memory unit when a number of errors occurring in the memory unit during a memory access operation is greater than the error value, wherein the error value is not updated when a most recent number of errors occurring in the memory unit during an operation accessing the memory unit is less than a current recorded value.

12. A non-volatile memory system as recited in claim 11, wherein the error value is updated to be equal to the number of errors occurring in the memory unit during the memory access operation.

13. A non-volatile memory system as recited in claim 11, further comprising:
    logic that searches the plurality of error values for a low error value upon receiving a request to write data to non-volatile memory; and
    logic that stores the data in the memory unit associated with the low error value.

14. A non-volatile memory system as recited in claim 13, wherein the low error value is associated with a free memory unit.

15. A non-volatile memory system as recited in claim 11, further comprising:
    logic that searches the plurality of error values of a lower error value; and
    logic that searches the plurality of error values for a higher error value;
    logic that moves data stored in a memory unit associated with the lower error value to the memory unit associated with the higher error value.

16. A non-volatile memory system as recited in claim 15, the data is moved upon receiving a request to perform static leveling.

17. A non-volatile memory system as recited in claim 15, wherein the higher error value is associated with a free memory unit.

18. A non-volatile memory system as recited in claim 11, further comprising:
    logic that erases a memory unit and records an erase error value equal to a number of memory cells that do not erase;
    logic that programs all memory cells of the memory unit and records a program error value equal to a number of memory cells that do not retain a programmed value; and
    logic that sets an error value associated with the memory unit as a function of the erase error value and the program error value.

19. A data structure, comprising:
    a plurality of error value entries indicating errors occurring in memory units comprising the non-volatile memory, each error value entry being associated with a particular memory unit in non-volatile memory,
    wherein an error value entry is set as a function of the number of errors occurring in the memory unit during a memory access operation, and wherein the error value entry is not set when a most recent number of errors occurring in the memory unit during an operation accessing the memory unit is less than a current recorded value.

20. A data structure as recited in claim 19, wherein the error value entry is set as a function of the number of errors occurring in the memory unit during a memory access operation when the number is greater than a value currently stored in the error value entry.

21. A data structure as recited in claim 19, wherein the data structure forms a portion of a block table.

* * * * *